US012690175B2

(12) United States Patent     (10) Patent No.:   US 12,690,175 B2

Roppelt et al.     (45) Date of Patent:     Jul. 21, 2026

(54) ARRANGEMENT FOR COOLING A POWER MODULE, AND POWER MODULE

(71) Applicant: Siemens Aktiengesellschaft, Munich (DE)

(72) Inventors: Bernd Roppelt, Unterhaid (DE); Jens Schmenger, Forchheim (DE); Thomas Schwinn, Herzogenaurach (DE); Roman Kögler, Nuremberg (DE); Alexander Luft, Nuremberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 20 days.

(21) Appl. No.: 18/021,033

(22) PCT Filed: Jul. 13, 2021

(86) PCT No.: PCT/EP2021/069525

§ 371 (c)(1),
(2) Date: Feb. 13, 2023

(87) PCT Pub. No.: WO2022/033789

PCT Pub. Date: Feb. 17, 2022

(65) Prior Publication Data

US 2023/0301039 A1     Sep. 21, 2023

(30) Foreign Application Priority Data

Aug. 14, 2020    (EP) .................................... 20191157

(51) Int. Cl.
    *H05K 7/20*     (2006.01)
(52) U.S. Cl.
    CPC ......... *H05K 7/209* (2013.01); *H05K 7/20418* (2013.01)

(58) Field of Classification Search
None
See application file for complete search history.

(56) References Cited

U.S. PATENT DOCUMENTS

| | | | | | |
|---|---|---|---|---|---|
| 5,309,979 | A | * | 5/1994 | Brauer | ................ H01L 23/4093 |
| | | | | | 174/16.3 |
| 6,025,991 | A | * | 2/2000 | Saito | .................. H05K 7/20436 |
| | | | | | 174/547 |

(Continued)

FOREIGN PATENT DOCUMENTS

| | | |
|---|---|---|
| CN | 102062325 A | 5/2011 |
| CN | 103222048 A | 7/2013 |

(Continued)

OTHER PUBLICATIONS

PCT International Search Report of International Searching Authority mailed Jun. 14, 2022 corresponding to PCT International Application No. PCT/EP2021/069525 filed Jul. 13, 2021.

(Continued)

*Primary Examiner* — Courtney L Smith

(74) *Attorney, Agent, or Firm* — Schmeiser, Olsen & Watts LLP

(57) ABSTRACT

An arrangement for cooling a power module with at least one power unit in a housing is provide, the arrangement having at least one heat sink, in which the arrangement for cooling has at least one heat-sink cover, and at least a part of the power module, in particular the housing, at least a part of the heat sink and/or at least a part of the heat-sink cover are/is configured in such a way that, after attachment of the heat-sink cover, the heat sink is fixed in the housing, in particular by way of clamping, through interaction of the configuration of heat sink, heat-sink cover and/or housing. Also, a power module having such an arrangement for cooling a power module is provided.

8 Claims, 5 Drawing Sheets

(56) References Cited

U.S. PATENT DOCUMENTS

| | | | | |
|---|---|---|---|---|
| 6,881,077 | B2 * | 4/2005 | Throum | H05K 5/15 |
| | | | | 174/16.3 |
| 10,667,439 | B1 * | 5/2020 | Song | H05K 7/14322 |
| 2006/0044762 | A1 * | 3/2006 | Kikuchi | H05K 7/209 |
| | | | | 257/E23.105 |
| 2007/0230127 | A1 * | 10/2007 | Peugh | H01L 23/053 |
| | | | | 361/699 |
| 2011/0170258 | A1 * | 7/2011 | Single | B25F 5/008 |
| | | | | 361/752 |
| 2011/0194247 | A1 * | 8/2011 | Nakasaka | H01L 23/4093 |
| | | | | 361/689 |
| 2012/0043652 | A1 * | 2/2012 | Ushijima | H05K 7/20936 |
| | | | | 257/E23.08 |
| 2013/0347051 | A1 * | 12/2013 | Bose | H04N 21/418 |
| | | | | 725/151 |
| 2016/0044825 | A1 * | 2/2016 | Baer | H05K 5/0217 |
| | | | | 165/80.2 |
| 2016/0120069 | A1 | 4/2016 | Raassina | |
| 2019/0174647 | A1 * | 6/2019 | Umeda | B60L 50/51 |
| 2021/0059068 | A1 * | 2/2021 | Tsunoda | H01L 23/467 |
| 2022/0061186 | A1 * | 2/2022 | Kimura | H05K 7/209 |
| 2022/0142014 | A1 * | 5/2022 | Ono | H05K 5/04 |
| | | | | 361/699 |
| 2023/0124688 | A1 * | 4/2023 | Nottelmann | H05K 3/303 |
| | | | | 361/720 |

FOREIGN PATENT DOCUMENTS

| | | |
|---|---|---|
| EP | 3016488 A1 | 5/2016 |
| EP | 3933913 A1 | 1/2022 |
| JP | 2009246063 A | 10/2009 |

OTHER PUBLICATIONS

Written Opinion of International Searching Authority mailed Jun. 14, 2022 corresponding to PCT International Application No. PCT/EP2021/069525 filed Jul. 13, 2021.

* cited by examiner

ARRANGEMENT FOR COOLING A POWER MODULE, AND POWER MODULE

CROSS-REFERENCE TO RELATED APPLICATIONS

This application claims priority to PCT Application No. PCT/EP2021/069525, having a filing date of Jul. 13, 2021, which claims priority to EP Application No. 20191157.5, having a filing date of Aug. 14, 2020, the entire contents both of which are hereby incorporated by reference.

FIELD OF TECHNOLOGY

The following relates to an arrangement for cooling a power module, and power module.

BACKGROUND

Arrangements for cooling power modules, that is to say substantially heat sinks which are generally attached in such power modules for cooling of power units installed in such a power module, are currently normally fastened to the housing of the power module by screws. As known for example from EP Application 20183215.1, which constitutes a subsequent publication, the power units installed on the heat sink, for example so-called IGBT (insulated gate bipolar transistor) modules, are attached, likewise by way of screws, to the heat sink. The heat sink thus requires various bores, broken-out regions and threaded bores for fastening.

This has consequences on the construction of the heat sink. In order for the screw connection to have a required strength, threaded bores must have a corresponding number of thread turns—specific minimum thicknesses, for example of the heat-sink root, are therefore necessary.

For the fastening bores for fastening of the heat sink in the housing, it is necessary for space to be provided on the heat sink. This space is situated for example in tabs laterally on the heat-sink root, since fastening to the ribs is not possible. It is also known that additional reinforced ribs, that is to say ribs which are provided with a minimum thickness for the stated purpose, are alternatively required.

Thus, the construction of the heat sink is not realized from thermal aspects alone, but rather a series of requirements for the fastening have to be taken into account.

Currently, a compromise between thermal characteristics and mechanics has to be accepted. As already described above, it is often the case that additional tabs or thicker ribs for fastening are attached to the heat sink. In the case of an extruded heat sink, these are taken into account for example in the contour of the die. A disadvantage in this case is that this gives rise to an outline running over the entire heat-sink length. Regions not required have to be subsequently milled again, thus resulting in additional work steps and consequently costs.

Furthermore, in order to achieve a specific thickness of the heat-sink root in the region of the threaded bores without unnecessarily thickening the complete heat-sink root, over-milling of the heat-sink root is also performed partially at the position of the power unit, which results in the same disadvantageous consequences, that is to say additional work steps and costs.

In the case of die-cast heat sinks, it is known that, although these may be designed in such a way that they already contain complete housing parts, so that the screw-connection points move to thermally non-critical positions, the dies for such heat sinks are very complicated and expensive. Moreover, alterations can be made a later stage only with great difficulty. Furthermore, the surface of contact with the power unit still has to be over-milled to produce the required surface quality.

Finally, screw-connection points for the power unit and the disadvantages associated therewith are still required in the case of these heat sinks.

US 2012/0043652 A1 has disclosed a semiconductor power module having an active element and a passive element that serve as semiconductor elements, wherein provision is made of a first heat pipe in order for the active element, the passive element and a cooling rib, which are arranged on a second heat pipe, to be included together between itself and the second heat pipe.

SUMMARY

An aspect relates to a solution which reduces the required structural space of power modules and improves heat removal and overcomes the disadvantages of the conventional art.

In the case of the arrangement according to embodiments of the invention for cooling a power module with at least one power unit in a housing, the arrangement having at least one heat sink, the arrangement for cooling has at least one heat-sink cover, wherein at least a part of the power module, in particular the housing, at least a part of the heat sink and/or at least a part of the heat-sink cover are/is configured in such a way that, after attachment of the heat-sink cover, the heat sink is fixed in the housing, in particular by way of clamping, through interaction of the configuration of heat sink, heat-sink cover and/or housing.

The arrangement according to embodiments of the invention for cooling is distinguished inter alia in that, by way thereof, it is possible to substantially dispense with connections, in particular by direct screwing, of the stated elements which have an adverse influence on the thermal properties of the heat sink that contribute to the heat dissipation ("heat removal").

The power module according to embodiments of the invention is distinguished in that it comprises an arrangement according to embodiments of the invention or one of its configurations and refinements.

In this way, it contributes to the implementation and thus, mutatis mutandis, to the realization of the advantages stated in connection with the arrangement.

The advantages and refinements specified below in relation to the arrangement can in this case be transferred analogously to the power module according to embodiments of the invention and the configurations thereof that result with the configurations of the comprised arrangement.

In one configuration of embodiments of the invention, the arrangement is configured in such a way that the power unit is fixed on the heat sink by material bonding, in particular by way of adhesive bonding, soldering and/or sintering. In this way, it is achieved that no or at least almost no screw connections to the power unit are required such that the heat sink is limited in terms of its heat-dissipation capacity, in particular by way of thickenings for guidance and/or receiving of the screws or of the threads. That is to say, this makes possible inter alia a more effective configuration and thus use of the heat sink, for example as a result of a then realizable lengthening of the ribs or increase in the number of ribs.

One configuration or refinement is provided in that the arrangement is formed in such a way that the configuration is realized at least partially as an at least partial form fit and/or force fit of heat sink, heat-sink cover and/or housing. Such a form fit supports the approach according to embodiments of the invention of configuring the cooling in an effective and space-saving manner and, for this purpose, dispensing substantially, as far as possible completely, with screw connections, since parts formed suitably according to embodiments of the invention can, by way of their interengagement, provide for fixing of the individual parts. For this purpose, according to embodiments of the invention, the existing shape of the parts, in particular of the heat sink, is largely maintained since, according to embodiments of the invention, the heat dissipation possibilities of a heat sink are intended to be exhausted, and furthermore the intention in this case, where possible, is also for the dimensions of the individual parts or of the entire arrangement to be kept as small as possible.

Alternatively or additionally, the heat sink according to embodiments of the invention may be refined in such a way that, for the form fit and/or force fit, at the heat-sink cover, there are formed elevations which engage with cutouts formed in the heat sink and/or in the housing for receiving the elevations and/or vice versa. Such a configuration allows the stated boundary conditions—exhaustion of the heat-dissipation capacities of the heat sink and minimization of the space requirement—to be maintained and at the same a more stable fixing to be ensured.

As a further addition or alternative configuration, the arrangement according to embodiments of the invention is configured in such a way that the form fit and/or force fit are/is configured by way of formation of at least one snap-action hook in the heat-sink cover and cutout in the heat sink and/or in the housing and vice versa. Snap-action hooks provide, by way of the latching-in, for a fixing which is not readily separable and, according to embodiments of the invention, are likewise able to be formed according to the boundary conditions. If the cutout is provided in the heat sink, then heat-sink cover and heat sink may be mounted into the housing as a compact/fixed formation. If, by contrast, final fixing of the elements during the mounting into the housing is envisaged, the cutout may alternatively or additionally be provided in the housing.

In a further configuration of the arrangement according to embodiments of the invention, the heat-sink cover and/or the heat sink are/is configured in such a way that, after attachment in the power module, at least one channel for air-stream guidance is formed, so that, without further space requirement, the cooling power of the heat sink is improved further within the context of embodiments of the invention.

In an embodiment, the arrangement according to embodiments of the invention will achieve the same effect if it is configured at least in such a way that, as a formation of the channel, the heat-sink cover and/or the heat sink are/is configured in such a way that, at least between at least one outermost cooling rib of the heat sink and the heat-sink cover, there is formed a spacing which is configured in such a way that an air stream, supplied in particular by a fan, for cooling is guided along the rib.

A further advantage provided by embodiments of the invention, specifically that the installation is simplified, is boosted or can be deliberately optimized even further if the arrangement according to embodiments of the invention is configured in such a way that the form fit is at least partially configured in such a way that heat sink, heat-sink cover and/or housing are/is at least partially mechanically guided during installation.

BRIEF DESCRIPTION

Some of the embodiments will be described in detail, with reference to the following figures, wherein like designations denote like members, wherein.

DETAILED DESCRIPTION

Figure 1:
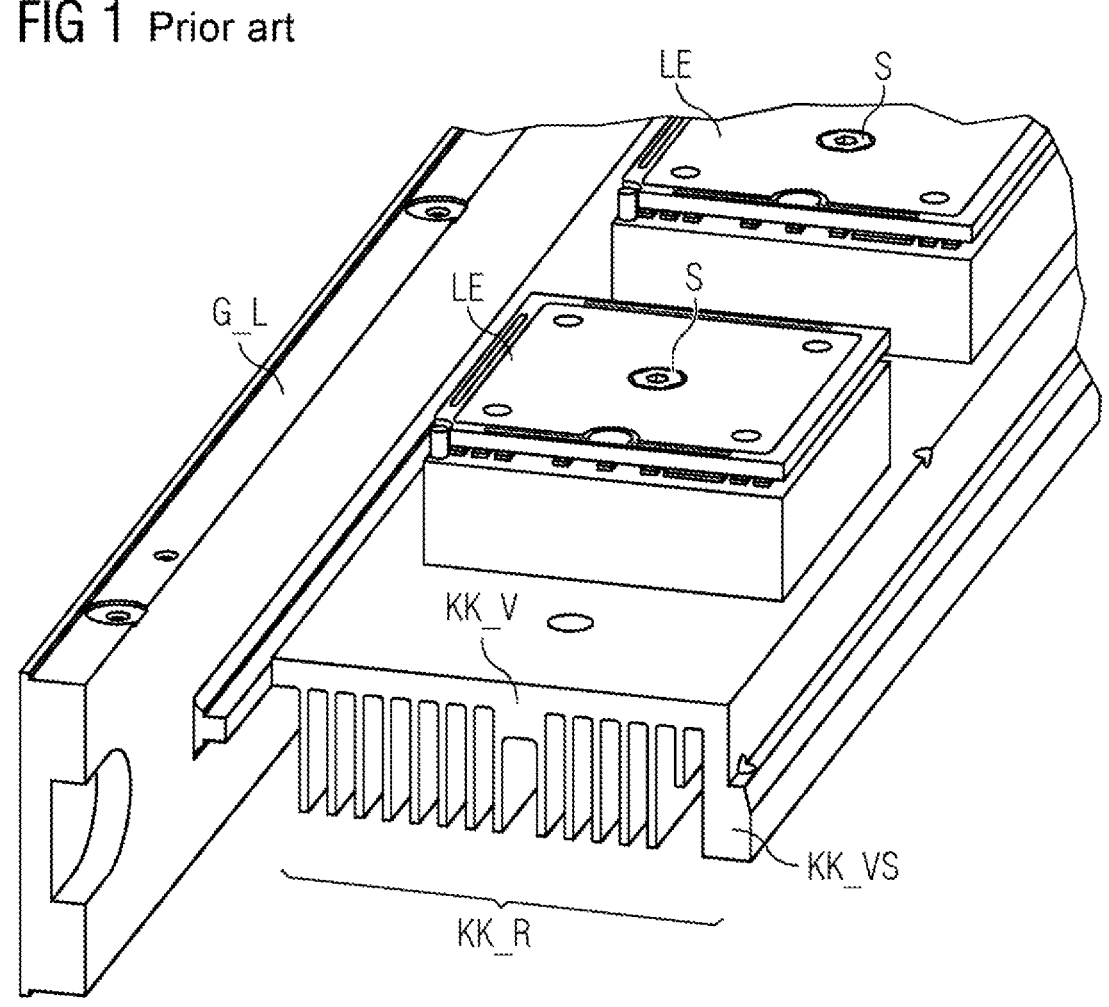
FIG. 1 shows a three-dimensional schematic illustration of a conventional arrangement of power units on a heat sink.
Figure 2:
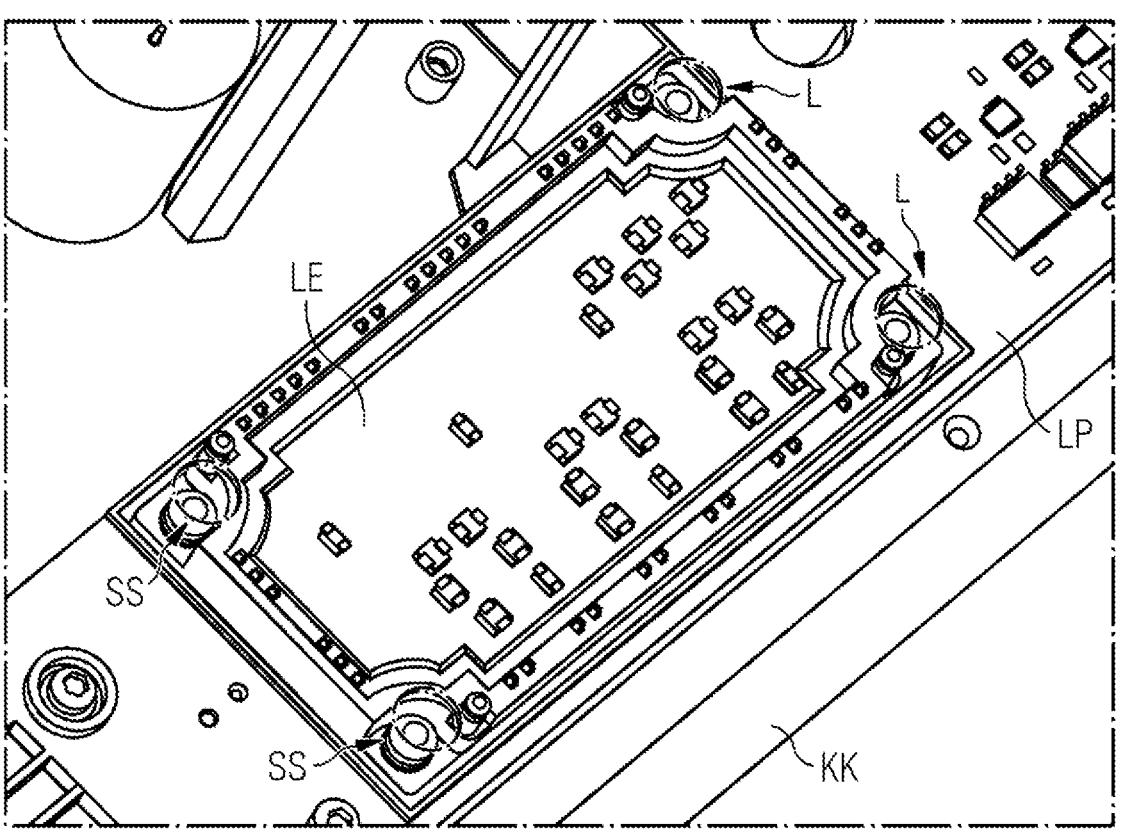
FIG. 2 shows a three-dimensional schematic illustration of a conventional configuration of a power module.

The exemplary embodiments explained below in FIG. 3 to FIG. 5 on the basis of the conventional art illustrated in FIG. 1 and FIG. 2 are embodiments and refinements of the invention.

In the exemplary embodiments, the described components of the embodiments each represent individual features of the invention which are to be considered independently of one another, and which each also refine embodiments of the invention independently of one another and are therefore also to be considered to be a constituent part of embodiments of the invention individually or in a combination other than that shown.

Furthermore, the described embodiments may also be supplemented by further features of the invention that have already been described.

Identical reference signs have the same meaning in the various figures.

FIG. 1, which illustrates the conventional art, shows a construction for dissipating heat ("heat removal") from two power units LE, each of which is fixed on a heat sink KK by a fastening screw S.

For fastening by the fastening screws, the heat sink KK is, as illustrated in FIG. 1, provided centrally with a reinforcement KK_V, which extends as a local thickening centrally along the so-called heat-sink root over the entire length of the heat sink KK. The thickening serves for guiding the screws S, which are introduced above the power unit LE and engage into the threads formed in the heat sink KK. This is also reason for the thickening, because, in order to produce a required strength (torque) of the screw connection, a sufficient number of thread turns has to be provided. The heat-sink root is not thick enough for this purpose and has to be reinforced at the screw-connection point.

As can be seen, this results in a change in spacing along the reinforcement of heat-sink ribs KK R formed on the heat-sink root. This in turn has the consequence that impairment of the cooling power occurs, since the spacing amounts to fewer cooling ribs KK R, the missing cooling ribs here not having been able to be formed and thus also not being able to be used thermally.

The same applies to the reinforcement KK_VS of the rib, which can be seen on the right-hand side of the heat sink KK. The rib thickening KK_V is used for fastening of the heat sink KK to a housing, the latter being screwed to the heat sink KK from below. As a result of this thickening, the effectiveness of the heat sink KK or the cooling contribution of each rib is altered.

FIG. 1 moreover shows, laterally on the left-hand side, that a housing rear-wall tab G_L, which serves for fastening of side plates, is provided. For this purpose, the tab G_L, which is formed on the heat sink KK, likewise has screw-connection points, for fastening of the side wall or further housing parts on the housing rear wall. Complex milling is necessary in this case. The housing rear-wall tab G_L is usable only to a minimum extent for waste-heat transport.

In summary, it can therefore be established that such an arrangement according to conventional art results not only in the limitation of the heat removal due to the fastening measures but also in a complex formation of the heat sink and thus in a costly production process.

Moreover, in the immediate vicinity of the heat sink, there are normally situated one or more circuit boards for control and contacting of the power unit(s) to be cooled, such as the power units LE.

This process, known from the conventional art, is illustrated in FIG. 2. With such an approach according to the conventional art, the power unit LE is firstly mounted onto the circuit board LP before it is screwed onto the heat sink KK—this takes place for example during the soldering-in or pressing-in process. For this purpose, it is generally necessary for provision to be made in the circuit board LP of relatively large holes L, through which a screwing tool fits at a later stage in order to then be able to screw the power unit LE firmly to the heat sink KK.

These holes L in the circuit board are however disadvantageous since not only does the space for the hole have to be provided on the circuit board but also air and creepage paths shorten by way of the hole L between the individual circuit-board layers, so that components and copper lines have to be placed at a distance from the holes L and consequently, for a certain extent around the hole L, technical use in terms of layout is additionally no longer possible. This results in the required circuit-board area and, as a consequence of this, generally in the enlargement of the components.

Figure 3:
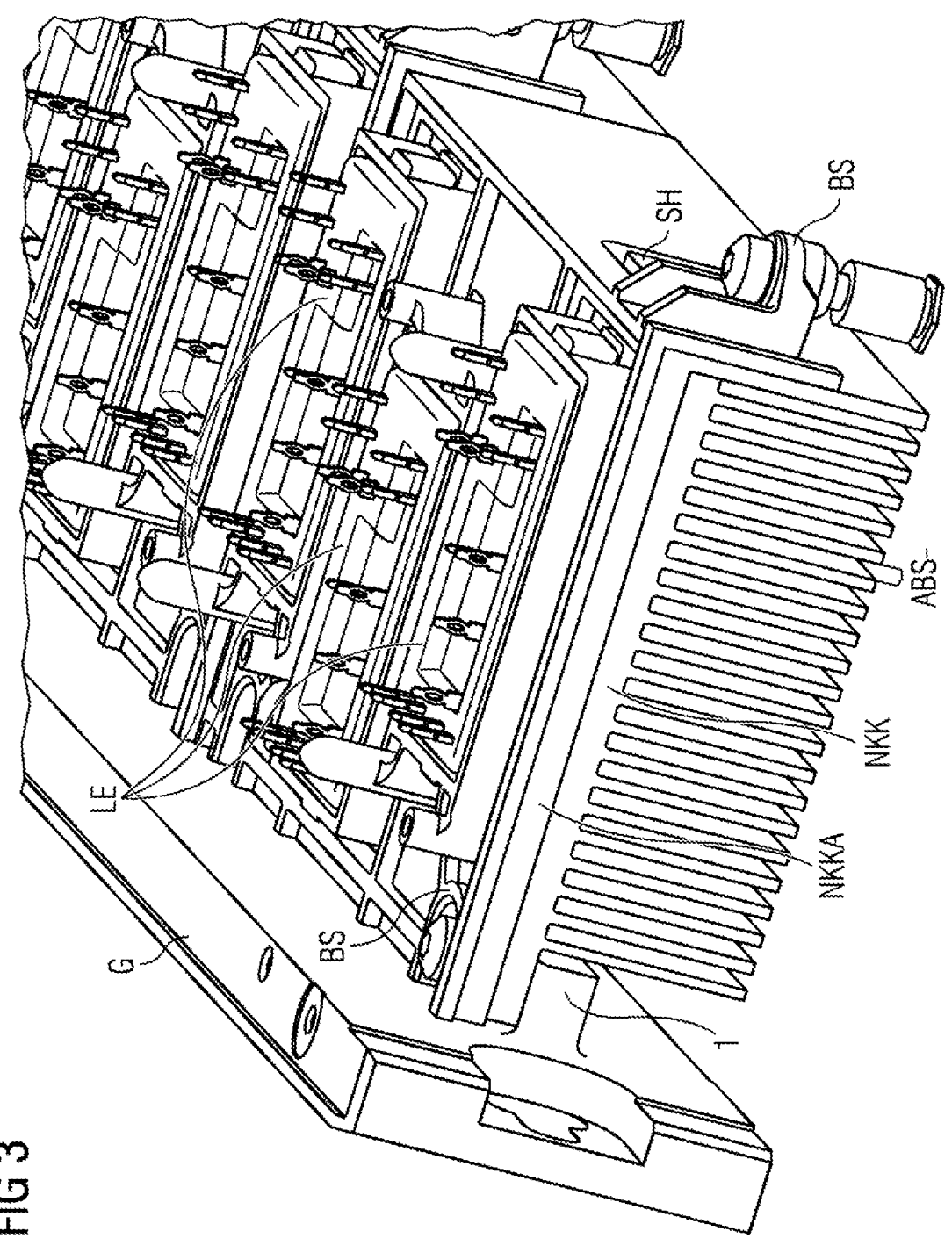
FIG. 3 shows a three-dimensional schematic illustration of a configuration of an arrangement according to embodiments of the invention.

FIG. 3 now shows a schematic illustration of a first configuration of an arrangement according to embodiments of the invention. It can be seen that the problem with the fastening of a heat sink in the housing is solved according to embodiments of the invention inter alia by a heat-sink cover NKKA formed according to embodiments of the invention and singled out by way of example from the range of possible forms according to embodiments of the invention. According to embodiments of the invention, the cover NKKA is configured in such a way that it is used not only for coverage of the heat sink NKK but also for guidance of the air stream. Thus, by way of this configuration, a solution is provided for air-stream guidance, as is commonly provided in such arrangements. There is thus no need for a further component. The cover according to embodiments of the invention is thus used with low outlay and in a space-saving manner.

According to embodiments of the invention, the heat-sink cover NKKA is designed in such a way that it engages snugly in a form-fitting manner around the heat sink NKK such that the latter is then in a sense indirectly held, in particular by way of clamping, via the cover NKKA. The heat sink NKK according to embodiments of the invention is consequently fixed within the device.

In an alternative or additional refinement, the cover NKKA according to embodiments of the invention is, as can be seen in FIG. 3, shaped in such a way that the heat sink NKK according to embodiments of the invention is pressed by the cover NKKA onto the shoulder of the housing rear wall G, as is indicated schematically by 1.

In this case, it is also possible for the heat sink NKK according to embodiments of the invention to be refined in such a way that it, too, is shaped so as to promote the form fit and/or force fit and/or to allow the fixing, in particular by way of holding and/or by way of clamping. Alternative configurations of embodiments of the invention, however, manage even without such shaping of the heat sink NKK. However, the heat sink NKK according to embodiments of the invention will be distinguished in that it will have no alterations, such as for example thickenings, which are necessary for a fastening and are detrimental with regard to cooling ribs or other measures providing the cooling.

The fastening takes place indirectly via the cover according embodiments of the invention, with or without such configurations. That is to say, the heat-sink cover NKKA according to embodiments of the invention push the heat sink NKK against the housing G. This is realized according to embodiments of the invention without additional fastening means between heat sink NKK and housing, such as screws, which, with regard to the cooling power, that is to say ultimately thermally, have an adverse effect.

As a refinement of this, FIG. 3 shows fastening points BS which are formed from the heat-sink cover NKKA and engage into corresponding counterpart pieces, for example on the housing and/or of the heat sink NKK, wherein the counterpart pieces are for this purpose configured in such a way that the fastening points BS engage, in particular in a form-fitting manner, into correspondingly formed points of the counterpart piece such that, in this way, it is inter alia the case that the heat sink NKK according to embodiments of the invention is held indirectly in the housing of the power module.

In the case shown, the fastening points BS are threaded bushings in the housing or threaded bores in the housing rear wall and, in the counterpart piece, formations in the heat-sink cover. This exemplary embodiment has the advantage that already existing formations in "standard parts" such as the housing do not have to be altered in order to contribute to the connection according to embodiments of the invention. Here, it is merely the case that the heat-sink cover according to embodiments of the invention is formed correspondingly while taking into account provided formations of the counterpart piece(s). In this way, the production outlay and/or the production costs can be reduced.

As a refinement, consideration may be given to replacement of the points for firm screwing by screws SS for power units LE in that the respective power unit LE is soldered, adhesively bonded or sintered directly to the heat sink NKK according to embodiments of the invention.

The two aforementioned configurations of embodiments of the invention, form-fitting and/or force-fitting heat-sink cover NKKA and soldered-on heat sink NKK, permit, both used individually and in combination, elimination of all the fastening points at the heat sink KK known from the conventional art and thus provision of the heat sink NKK according to embodiments of the invention, which is designed according to thermal aspects, and in particular also optimization in this respect thereof.

It goes without saying that it is also possible, with use of only one of the two configurations or else both in combination, to at least minimize, and not allow complete elimination of, the screw-connection points and/or fastening points if, for individual implementations, individual screw connections should be unavoidable.

Figure 4:
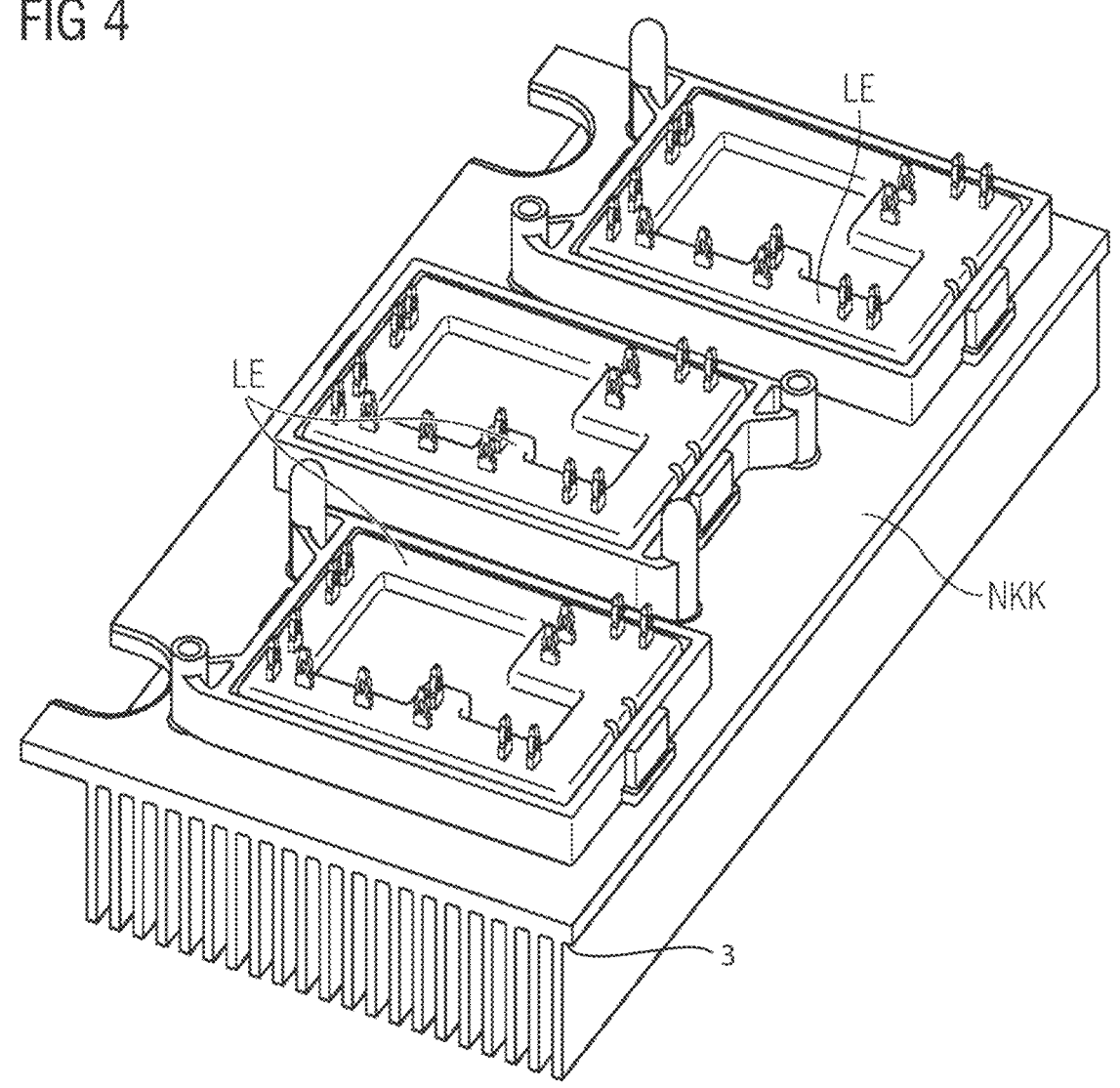
FIG. 4 shows a three-dimensional schematic illustration of a configuration of a heat sink according to embodiments of the invention, with power units included.

In principle, however, according to embodiments of the invention, the intention is for the number of screws and/or fastening points, in particular at the heat sink NKK, where possible, to be reduced to zero, so that an arrangement of power units LE on a heat sink NKK according to embodiments of the invention, such as illustrated in FIG. 4, is the result, in the case of which the heat sink NKK has no manipulations intended for screw connections and the power units LE are attached to the heat sink NKK by way of soldering or by sintering.

Figure 5:
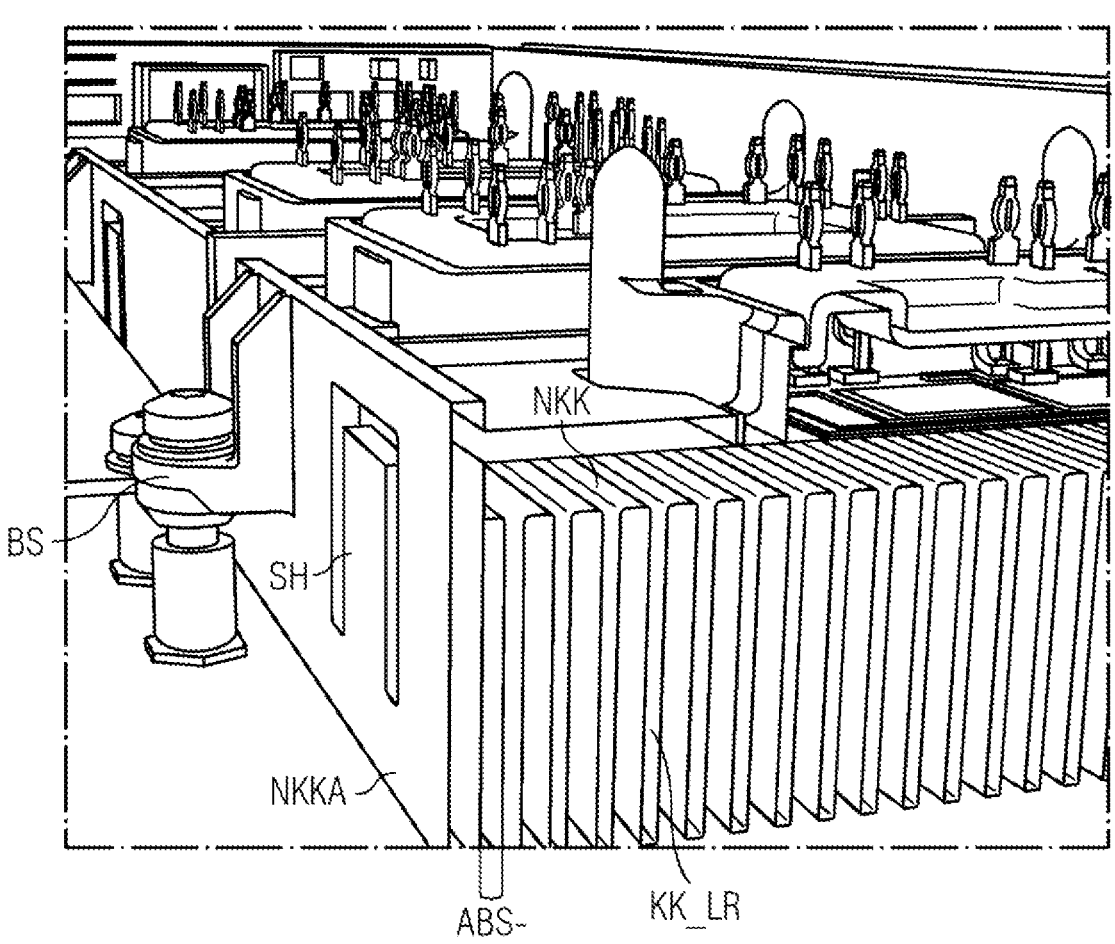
FIG. 5 shows a three-dimensional schematic illustration of a detail of the arrangement according to embodiments of the invention in a full section.

A further configuration or refinement of the heat-sink cover NKKA according to embodiments of the invention becomes apparent if, as is the case in FIG. 5, it is illustrated, and is considered, in a full section. In this case, it becomes apparent that the heat-sink cover according to embodiments of the invention, according to the exemplary embodiment shown, is designed in such a way that the elimination of thickened ribs for fastening is used in such a way that the heat-sink cover NKKA according to embodiments of the invention is designed in such a way that a spacing ABS to the last cooling rib KK_LR is formed, as can be seen in FIG. 5 by way of the illustration in a full section.

This yields a further, distinct advantage that the air stream of a fan can be introduced in such a way that the last rib is flowed around by air from both sides and can thus be used fully for cooling.

Furthermore, as a result of the flowing air between last cooling rib and heat-sink cover NKKA, the interior space of the device is thermally decoupled from the heat sink NKK. The device interior space is made cooler. The service life of structural elements situated there increases, or less expensive structural elements may be installed.

FIG. 5 moreover shows, as a further possible refinement, that the heat-sink cover NKKA according to embodiments of the invention is also provided with a snap-action hook SH, which serves for fastening of the modified heat-sink cover NKKA to the heat sink. It goes without saying that such hooks may alternatively or additionally also be provided on the heat sink or other parts of the arrangement according to embodiments of the invention, wherein the counterpart piece, such as cutout 3 shown in FIG. 4, is formed correspondingly for arresting of the snap-action hook SH or the snap-action hook is placed and formed in such a way that it is arrested by way of convexities that are already provided through the design of the respective counterpart piece.

In this way, one of the concepts according to embodiments of the invention for making as few alterations as possible for the elements involved, in particular none which could inhibit advantageous thermal properties for the cooling, is taken into account.

Embodiments of the invention are not restricted to the described configurations and refinements or the described combinations. Rather, all the resulting variants and combinations covered by the claims are considered as belonging to embodiments of the invention and also are taken into account in an implementation accordingly. Implementations are assessed as being according to embodiments of the invention in particular if they have one or more of the following features:

1. The heat sink NKK is not fastened directly to the housing, but is held indirectly via the heat-sink cover NKKA. If screws are used for fastening to the housing, then they are not in direct contact with the heat sink NKK.
2. The power unit LE is not screwed to the heat sink NKK, but is soldered on, "sintered on" and/or adhesively bonded to the latter.

3. The combination of features 1. and 2. and thus also a heat sink NKK which has at least almost no screw-connection points.
4. Between heat-sink cover NKKA and last rib(s) KK_LR of the heat sink KK, there is a gap ABS in which the air stream of the fan in introduced.

Furthermore, the following advantages, or alternative and/or additional configurations/refinements, according to embodiments of the invention are attained:

The heat-sink cover NKKA combines one or more of the following functions, such as for example mechanical fastening of the heat sink NKK, directing of air in the air channel, thermal isolation with respect to the interior space, electrical insulation, in particular through enlargement of the air and creepage paths, between heat sink NKK and power electronics, guidance for installation of the power module containing the power units LE into the device, and is thus a component for multiple functions.

The heat sink NKK can be thermally optimized, so that it may be made either smaller or more powerful, so that better utilization of the heat sink NKK can be ensured.

Significant increase in heat-sink ribs and thus cooling power. In the illustrated configurations, an increase in the number of ribs by approximately +33% with the same installation volume is obtained by the configuration according to embodiments of the invention.

Very simply designed and thus inexpensive heat sinks NKK are possible by way of the configurations of embodiments of the invention. Consequently, simple structures are possible and, not least as a result of this, fewer processing steps are necessary.

More compact devices are possible.

Holes L in the circuit board LP can be minimized and consequently circuit-board area can be saved.

Cost saving.

Lower interior-space temperature.

Although the present invention has been disclosed in the form of embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. An arrangement for cooling a power module with at least one power unit in a housing, the arrangement comprising:
   at least one heat sink;
   at least one heat-sink cover, wherein at least a part of the at least one heat sink and at least a part of the at least one heat-sink cover are configured in such a way that the at least one heat sink is fixed in the housing through interaction of a configuration of the at least one heat sink and the at least one heat-sink cover;
   wherein the configuration is a force fit of the at least one heat sink and the at least one heat-sink cover;
   wherein the force fit is configured by way of formation of at least one snap-action hook in the at least one heat-sink cover and a cutout in the at least one heat sink.

2. The arrangement as claimed in claim 1, wherein the at least one power unit is fixed on the at least one heat sink by way of adhesive bonding, soldering, and/or sintering.

3. The arrangement as claimed in claim 1, wherein, for the force fit, there are formed elevations which engage with the cutouts formed in the at least one heat sink for receiving the elevations.

4. The arrangement as claimed in claim 1, wherein the at least one heat- sink cover and/or the at least one heat sink are/is configured in such a way that, when the at least one heat sink is fixed in the housing at least one channel for air-stream guidance is formed.

5. The arrangement as claimed in claim 4, wherein as a formation of the at least one channel, the at least one heat-sink cover and/or the at least one heat sink are/is configured in such a way that, at least between at least one outermost cooling rib of the at least one heat sink and the at least one heat-sink cover, there is formed a spacing which is configured in such a way that an air stream for cooling is guided along the at least one outermost rib.

6. The arrangement of claim 1, wherein, as a result of the configuration of the at least one heat sink, the at least one heat-sink cover, and/or the housing, the at least one heat sink is not directly fastened to the housing.

7. The arrangement as claimed in claim 1, wherein the at least one heat sink includes a plurality of ribs extending therefrom, and the at least one heat-sink cover is placed on the at least one heat sink on a side opposite the plurality of ribs.

8. The arrangement as claimed in claim 1, wherein the at least one snap-action hook is formed as a protrusion extending from the at least one heat-sink cover, and wherein the cutout is formed as a corresponding recess in the at least one heat sink for receiving the protrusion.

* * * * *